(12) United States Patent
Chamas et al.

(10) Patent No.: US 11,367,697 B2
(45) Date of Patent: Jun. 21, 2022

(54) HIGH-DENSITY FLIP CHIP PACKAGE FOR WIRELESS TRANSCEIVERS

(71) Applicant: QUALCOMM Incorporated, San Diego, CA (US)

(72) Inventors: Ibrahim Ramez Chamas, Carlsbad, CA (US); Mohamed Abouzied, La Jolla, CA (US); Bhushan Shanti Asuri, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/875,972

(22) Filed: May 15, 2020

(65) Prior Publication Data

US 2021/0358871 A1 Nov. 18, 2021

(51) Int. Cl.
| | | |
|---|---|---|
| *H01L 23/66* | (2006.01) | |
| *H01L 23/00* | (2006.01) | |
| *H01L 23/58* | (2006.01) | |
| *H03H 7/42* | (2006.01) | |
| *H04B 1/40* | (2015.01) | |

(52) U.S. Cl.
CPC .......... *H01L 23/66* (2013.01); *H01L 23/562* (2013.01); *H01L 23/585* (2013.01); *H01L 24/13* (2013.01); *H03H 7/42* (2013.01); *H01L 2223/6655* (2013.01); *H01L 2223/6677* (2013.01); *H01L 2224/13026* (2013.01); *H01L 2224/13147* (2013.01); *H01L 2924/19051* (2013.01); *H01L 2924/3512* (2013.01); *H04B 1/40* (2013.01)

(58) Field of Classification Search
CPC ..... H01L 23/66; H01L 23/562; H01L 23/585; H01L 23/645; H01L 24/13; H01L 2223/6655; H01L 2223/6677; H01L 2224/13026; H01L 2224/13147; H01L 2224/0401; H01L 2924/19051; H01L 2924/3512; H03H 7/42; H03F 2200/06; H03F 2200/09; H04B 1/40; H03D 2200/0023
USPC ........................................ 257/428
See application file for complete search history.

(56) References Cited

U.S. PATENT DOCUMENTS

| | | | |
|---|---|---|---|
| 9,496,231 B1 | 11/2016 | Tsai et al. | |
| 10,291,283 B2 * | 5/2019 | Kamgaing | H04B 1/48 |
| 10,566,409 B2 * | 2/2020 | Lesenco | H01L 23/5225 |
| 10,950,542 B2 * | 3/2021 | Steigerwald | H03F 3/195 |
| 2010/0181642 A1 | 7/2010 | Sarfaraz et al. | |
| 2011/0128084 A1 * | 6/2011 | Jin | H03F 3/195 336/105 |
| 2012/0056297 A1 * | 3/2012 | Akhtar | H01F 41/041 257/E21.022 |
| 2014/0273825 A1 | 9/2014 | Sapone et al. | |
| 2017/0012601 A1 * | 1/2017 | Yen | H03H 7/42 |
| 2017/0359097 A1 * | 12/2017 | Uchida | H01L 23/552 |

OTHER PUBLICATIONS

International Search Report and Written Opinion—PCT/US2021/027338—ISA/EPO—dated Aug. 10, 2021.

* cited by examiner

*Primary Examiner* — Dao H Nguyen
(74) *Attorney, Agent, or Firm* — Haynes and Boone, LLP

(57) ABSTRACT

An RF flip chip is provided in which a local bump region adjacent a die corner includes a balun having a centrally-located bump.

21 Claims, 8 Drawing Sheets driving a differential RF signal into a first coil of a balun located within a local bump region abutting a corner region for an RF flip chip die, the first coil being formed about a central balun region including a floating copper pillar for the local bump region ~600 producing a single-ended RF signal in a second coil of the balun responsive to the driving of the differential RF signal ~605

FIG. 6

HIGH-DENSITY FLIP CHIP PACKAGE FOR WIRELESS TRANSCEIVERS

TECHNICAL FIELD

This application relates to integrated circuit packaging, and more particularly to a high-density flip chip package for wireless transmitters and receivers.

BACKGROUND

As compared to purely digital devices, radio frequency (RF) systems for wireless applications generally require a number of passive devices for filtering and matching purposes. These passive devices are difficult to integrate onto a single semiconductor die with other transceiver components. Similarly, the various active components in a wireless transceiver such as power amplifiers are often produced using semiconductor technologies that require different semiconductor technologies as compared to more-digitally-based components such as a modem. A transceiver for a wireless device such as a cellular telephone will thus have a number of diverse semiconductor dies and passive components. It is beneficial to integrate these various discrete dies and passive components into an RF system-in-package (SiP). For example, an RF SiP provides a number of advantages such as improved power efficiency, the streamlining of design, and noise reduction. Despite these advantages, the design goal of increasing density must overcome numerous challenges.

SUMMARY

In accordance with a first aspect of the disclosure, an RF flip chip die is provided that includes: a crack stop region including a corner of the die; and a local bump region abutting the crack stop region, the local bump region including: a first balun formed by coils arranged about a center region; and a die interconnect located within the center region.

In accordance with a second aspect of the disclosure, a method of RF signaling is provided that includes: driving a differential RF signal into a first coil of a balun located within a local bump region abutting a corner region for an RF flip chip die, the first coil being formed about a central balun region including a floating copper pillar for the local bump region; and producing a single-ended RF signal in a second coil of the balun responsive to the driving of the differential RF signal.

In accordance with a third aspect of the disclosure, an RF flip chip is provided that includes: a semiconductor substrate having a corner region about a corner of the semiconductor substrate; a plurality of metal layers adjacent the corner region, the plurality of metal layers being configured to form a first balun having coils; a first copper pillar; and an uppermost dielectric layer having a portion located between a center region of the coils and the first copper pillar.

In accordance with a fourth aspect of the disclosure, a method of RF signaling is provided that includes: driving a single-ended RF signal in a first coil of a balun located within a local bump region abutting a corner region for an RF flip chip die, the first coil being formed about a central balun region including a floating copper pillar for the local bump region; and producing a differential RF signal in a second coil of the balun responsive to the driving of the single-ended RF signal.

These and other advantageous features may be better appreciated through the following detailed description.

BRIEF DESCRIPTION OF THE DRAWINGS

FIG. 6 is a method of RF signaling using a balun within a local bump region in accordance with an aspect of the disclosure.

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
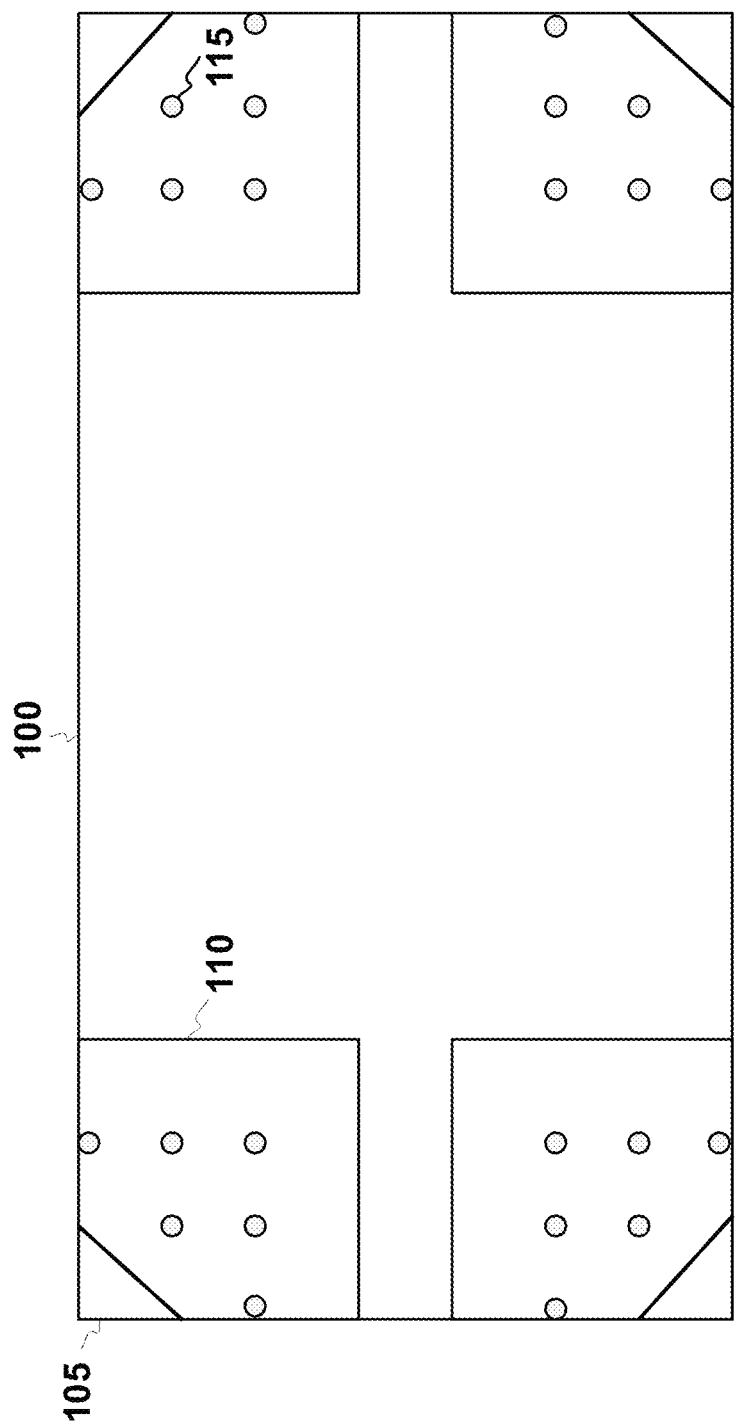
FIG. 1 illustrates a conventional RF flip chip in which the local bump regions have a uniform distribution of bumps.

The integration of dies into an RF integrated circuit package such as a SiP may use a number of approaches such a wire bonding and flip chip technologies. Flip chip mounting of a die is especially attractive due to the increased density of interconnections that it provides as compared to wire bonding. In both types of packaging, a die has an active surface in which active devices such as transistors are formed. This active surface faces away from an underlying substrate such as a package carrier in wire bonded applications. But in flip chip packaging, the active surface of the die faces the package carrier. The "flip" in flip chip packaging thus stems from the fact that the die is "flipped" upside down as compared to its orientation in a conventional wire bonding application.

The interconnections between a flip chip die and the underlying substrate may be formed using solder balls. To further increase density, these interconnections may be formed using metallic pillars (e.g., copper pillars). In the following description, the term "bump" will be understood to refer to a generic flip chip interconnection regardless of whether that interconnection is a solder ball or a metallic pillar. However, note that a solder bump has an inherent spherical shape that limits the bump density. In contrast, a metallic pillar such as a copper pillar can be spaced with considerably improved bump density. The following discussion will thus be directed to embodiments in which the bumps are copper pillars without loss of generality. But even with the use of copper pillars to form the bumps, a number of impediments inhibit further advances in density. For example, it is conventional to form a die from a semiconductor wafer that contains the layout for numerous other dies. To separate the wafer into individual dies, the wafer is sectioned in the Cartesian x and y directions such that each die is rectangular. The rectangular shape for the die results in mechanical stress in the die corners. There is thus a crack stop region at each die corner to limit this mechanical stress. Within a crack stop region, no bumps are allowed. But across the remaining active surface of the die, the bump density must satisfy a minimum threshold density to properly secure the die to the underlying substrate. In addition, there is also a minimum separation distance between each bump. These two factors of the minimum bump density and the minimum bump separation cause density issues, for example, in a square area of the die (denoted herein as the local bump region) that includes the die corner and its crack stop region. The local bump region definition depends upon the semiconductor manufacturing requirements, but it will it will be assumed herein that if the minimum bump separation is defined by a pitch p, then the local bump region width and length are 3*p in some semiconductor processing technologies. The minimum bump separation or pitch p may be defined as the minimum separation of a center of a bump to a center of the neighboring bump. In one semiconductor processing node, p equals 130 µm. It will be appreciated, however, that the pitch p and the local bump region width and length will vary according to the semiconductor processing node or technology.

The crack stop region may form a right triangle in which the vertex of the right angle is the die corner. If bumps are evenly distributed across a 3*p length and width of the local bump region, then such a local bump region would have six bumps. This may be better appreciated with regard to an example die 100 shown in FIG. 1. Die 100 has four corners and thus has four crack stop regions 105 and four associated local bump regions 110 each having six bumps 115. Additional bumps may be added if the bump distribution was not homogenous. Regardless of the number of bumps 115, their inclusion in each local bump region 110 has traditionally limited the type of components that may be integrated into the die's active surface (not illustrated) below each local bump region 110.

In general, a local bump region may be defined by a rectangular region of the die that includes a die corner and has a length and width greater than the bump pitch p. Since the base and length of the crack stop region is the bump pitch p, the resulting rectangular region of the die will thus include the crack stop region. A local bump region may be further defined to include what remains of the rectangular region when the crack stop region is excluded. Thus, the local bump region may be a region of the die that abuts the crack stop region. Since the local bump region abuts the crack stop region that includes the die corner, the local bump region may also be denoted herein as a corner region of the die. In some embodiments the local bump region may have a shape other than a rectangle or a rectangle with a corner removed.

The local bump regions 110 and the example die 110 are not necessarily drawn to scale in FIG. 1. The die 100 may be sized and/or shaped such that the local bump regions 110 are spaced further apart than illustrated. Further the aspect ratio and or shape of the die 100 may differ from the illustration.

One type of component that is commonly used in an RF frontend application is a balun. For example, die 100 may be a transceiver die that includes various RF components such as mixers and/or filters. Such a transceiver may use differential signaling, for example due to its favorable elimination of common-mode disturbances. But commonly-used antennas such as patch antennas in a cellular phone application may not be amenable to being driven by a differential RF signal or it may not be beneficial to route differential signals to such elements. In these configurations, a single-ended RF signal may be used to drive the antenna. Similarly, power amplifiers for amplifying an RF signal before it drives an antenna are also commonly single-ended. Because power amplifiers for wireless applications often use semiconductor processes that are not amenable to those used to construct the transceiver, the transceiver and the power amplifier may be located on separate dies. A balun transforms the differential RF signal into a signal-ended RF signal so that a transceiver die may drive the resulting singled-ended RF signal to a power amplifier die. The resulting dies may be integrated into an RF frontend system-in-package or instead may remain as discrete devices or be packaged into modules that are coupled through a circuit board.

Figure 2:
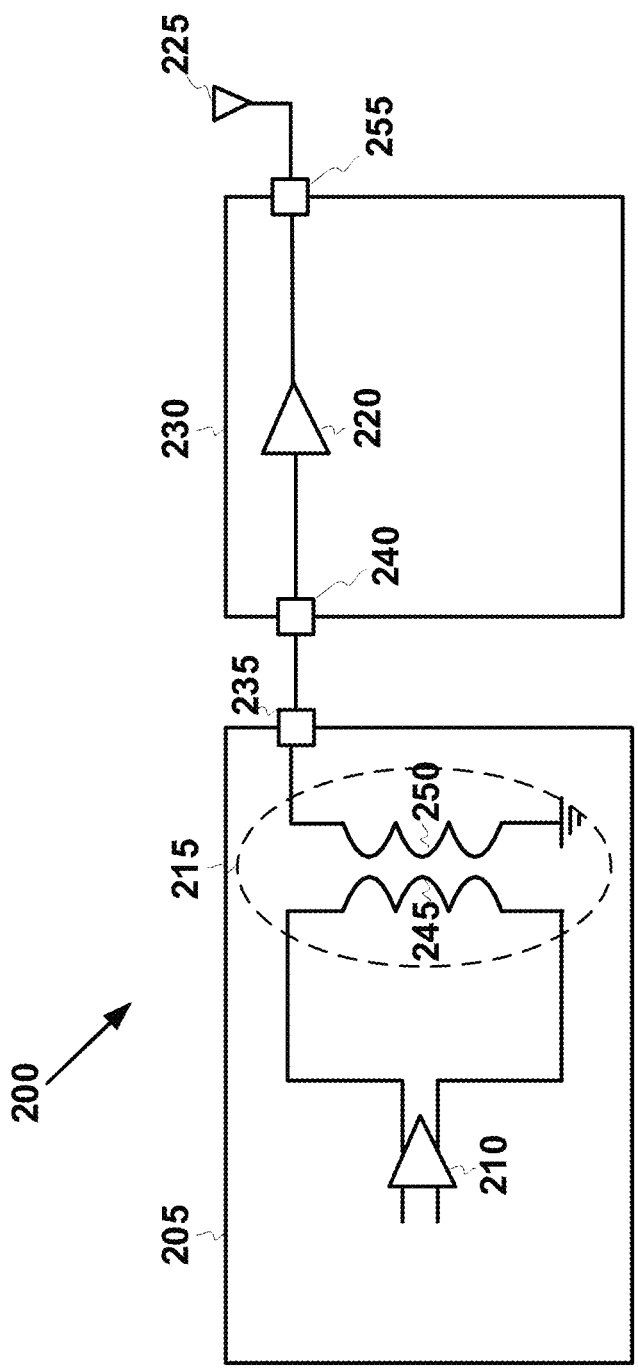
FIG. 2 illustrates an RF system that includes an RF flip chip having a local bump region in accordance with an aspect of the disclosure.

An example RF frontend system 200 is shown in FIG. 2. A transceiver die 205 includes an RF driver or amplifier 210 that drives a differential RF signal through a first coil 245 in a balun 215. In response to the differential signaling, a second coil 250 in balun 215 produces a single-ended RF signal that is driven out from transceiver die 205 on a bump 235. Another end of second coil 250 is grounded.

A power amplifier die 230 receives the single-ended RF signal on a bump 240. Alternatively, die 230 may be wire-bonded. In a SiP embodiment for system 200, dies 205 and 230 may both be flip-chip mounted to a carrier (not illustrated). Alternatively, dies 205 and 230 may be separately packaged such that their integration in system 200 would be through a circuit board. A power amplifier 220 in die 230 amplifies the single-ended RF signal to drive an antenna 225 through another bump 255.

Note that balun 215 may instead function during a receive mode of operation. For example, die 230 may include a low-noise amplifier (not illustrated) that would amplify a received RF signal from antenna 225. The resulting amplified received RF signal would drive second coil 250 in balun 215 to produce a differential received RF signal at first coil 245.

Figure 3:
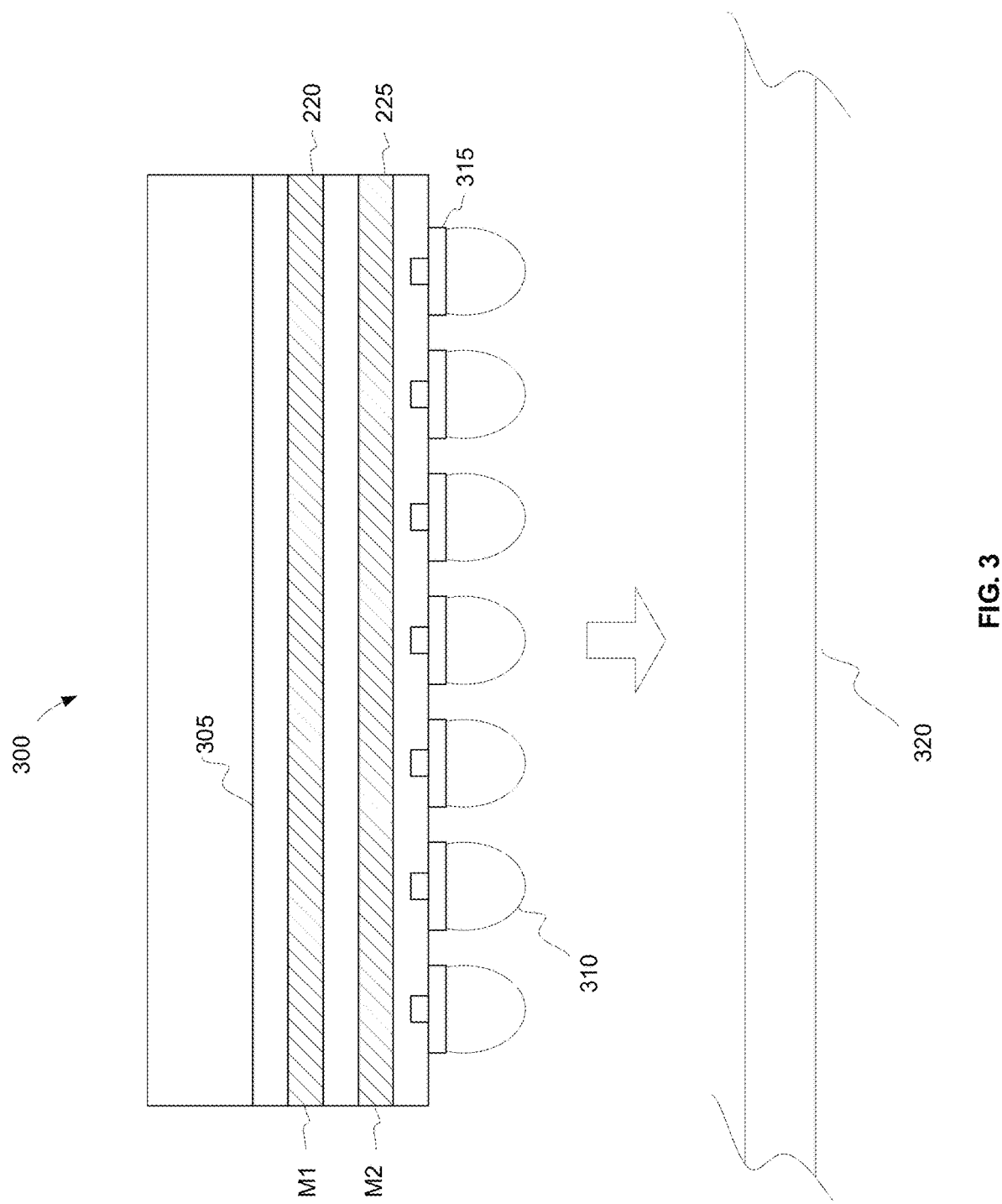
FIG. 3 illustrates the mounting onto a carrier substrate of an RF flip chip with a local bump region in accordance with an aspect of the disclosure.

Balun 215 is a passive component that may not be integrated into an active surface of the die. Instead, balun 215 may be formed in the metal layers adjacent the active surface of transceiver die 205. Some example metal layers in a flip chip die 300 are shown in FIG. 3. Die 300 has an active surface 305 in which various active components such as transistors are integrated. Active surface 305 is separated from various metal layers by corresponding dielectric layers. For illustration clarity, only a first metal layer M1 and a second metal layer M2 are shown but it will be appreciated that a greater plurality of metal layers are typically provided. As known in the semiconductor arts, metal layers such as metal layers M1 and M2 are patterned to form various conductors for signals for die 300 as well as to provide power and ground. In addition, the metal layers may be patterned to form passive components such as the inductive coils in balun 215 (FIG. 2). After the metal layers are patterned as desired, pillars 310 may be deposited such as through electroplating. Pillars 310 attach to a final or outermost dielectric layer through under bump metallization (UBM) regions 315. Referring again to FIG. 1, each crack stop region 105 may also be denoted as an UBM keep out region as there is no UBM formation in crack stop regions 105. Die 300 is then mounted onto a substrate 320 through a fusing of substrate 320 to pillars 310. Substrate 320 would have analogous metal layers for the distribution of signals, power, and ground. In an SiP embodiment, substrate 320 may be a carrier that also supports power amplifier die 230. Alternatively, substrate 320 may be a circuit board in embodiments in which transceiver die 205 and power amplifier die 230 are packaged separately.

Figure 4A:
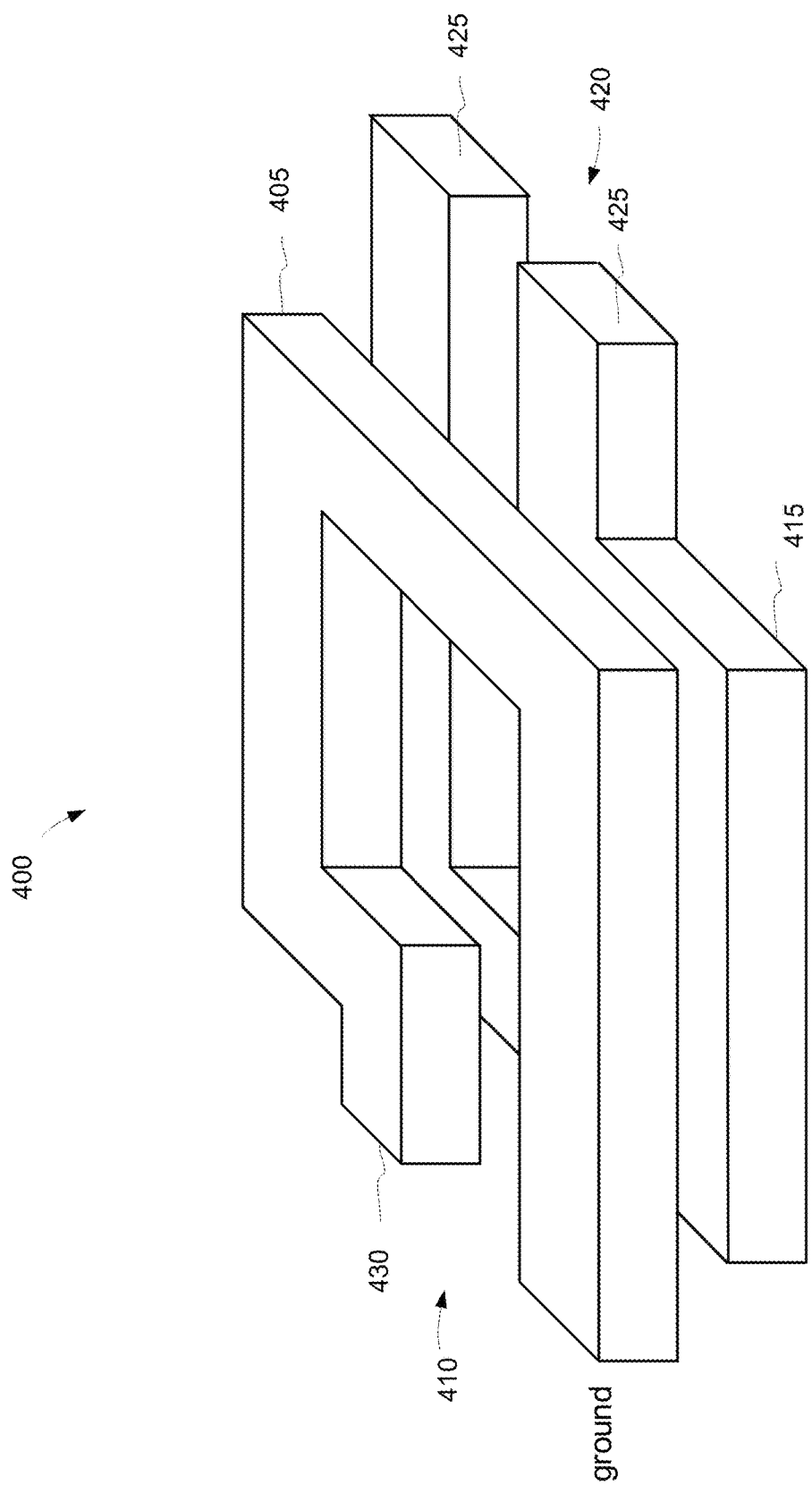
FIG. 4A is a simplified perspective view of a balun for a local bump region in accordance with an aspect of the disclosure.
Figure 4B:
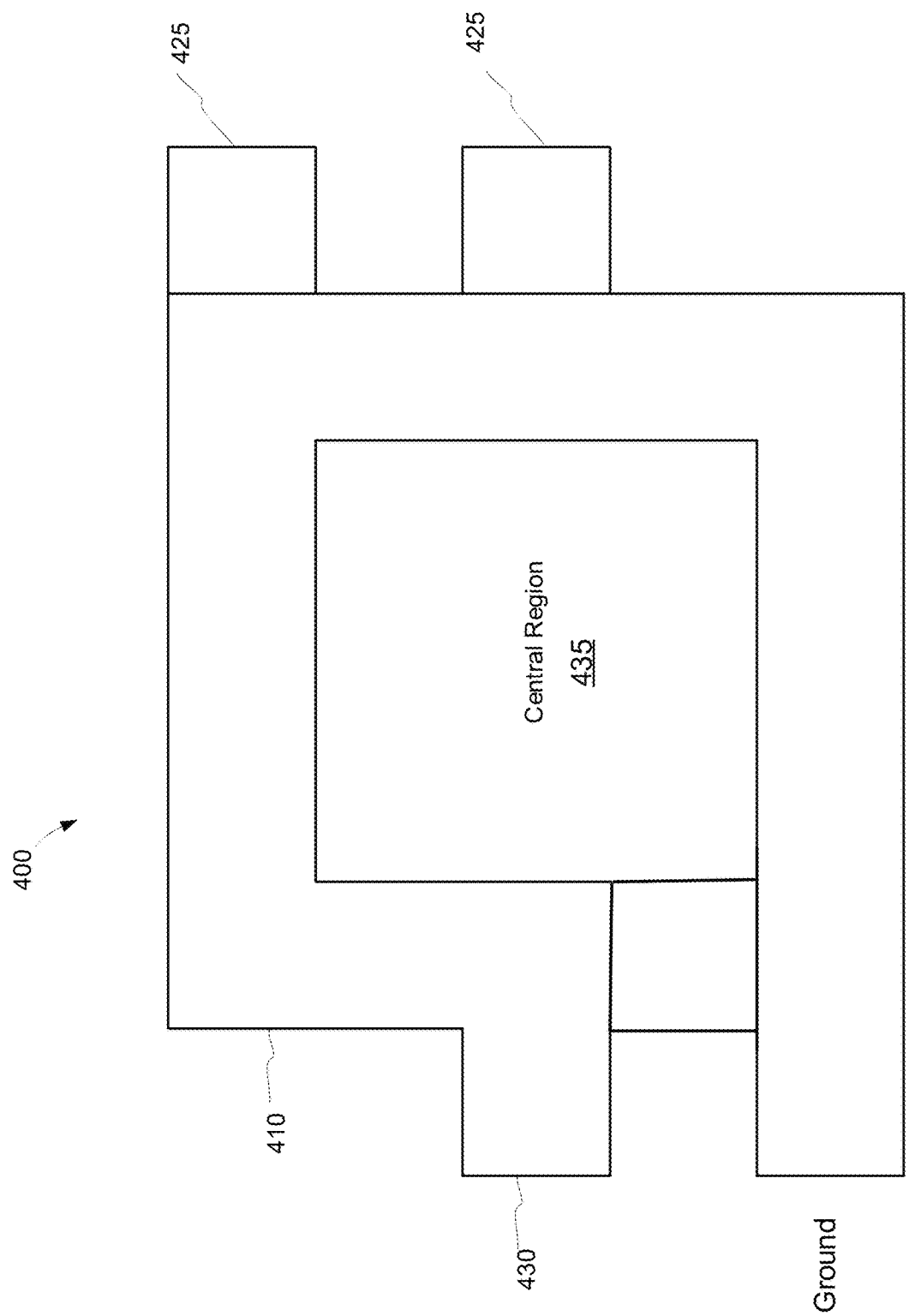
FIG. 4B is a plan view of the balun of FIG. 4A.

The patterned metal layers forming a balun 400 are shown in a perspective view in FIG. 4A. In this simplified view, a metal layer 405 is patterned into an open-ended loop to form a first coil 410. Similarly, a metal layer 415 is patterned into another open-ended loop to form a second coil 420. In general, each coil may be distributed across more than one metal layer with multiple loops in each metal layer. Further, while first coil 410 is illustrated as being above second coil 420, this order may be reversed or the coils may be interleaved in alternative embodiments. It will thus be appreciated that balun 400 is being shown in simplified form for illustration clarity. In balun 400, second coil 420 includes two input ports 425 for receiving the differential RF signal. First coil 410 includes an output port 430 for the single-ended RF signal and also an output port for ground. Each coil surrounds a central region 435 as shown in the plan view of FIG. 4B.

Referring again to FIG. 1, a balun such as balun 215 or balun 400 is typically excluded from LBRs 110. The required bump density would result in signal interference with the operation of such a balun. For this reason, it is conventional to use the die space underlying each LBR 110 for the integration of other components such as input/output (I/O) switches and attenuators, electrostatic discharge (ESD) protection circuitry, and digital block transceiver control circuitry. But the use of such conventional components does not fully occupy the die space area under each LBR 110. For example, a common utilization factor for the LBR die space is approximately 55%. To dramatically improve the die space usage (and thus increase density) for LBRs 110, an LBR layout is provided that includes at least one balun.

Figure 5:
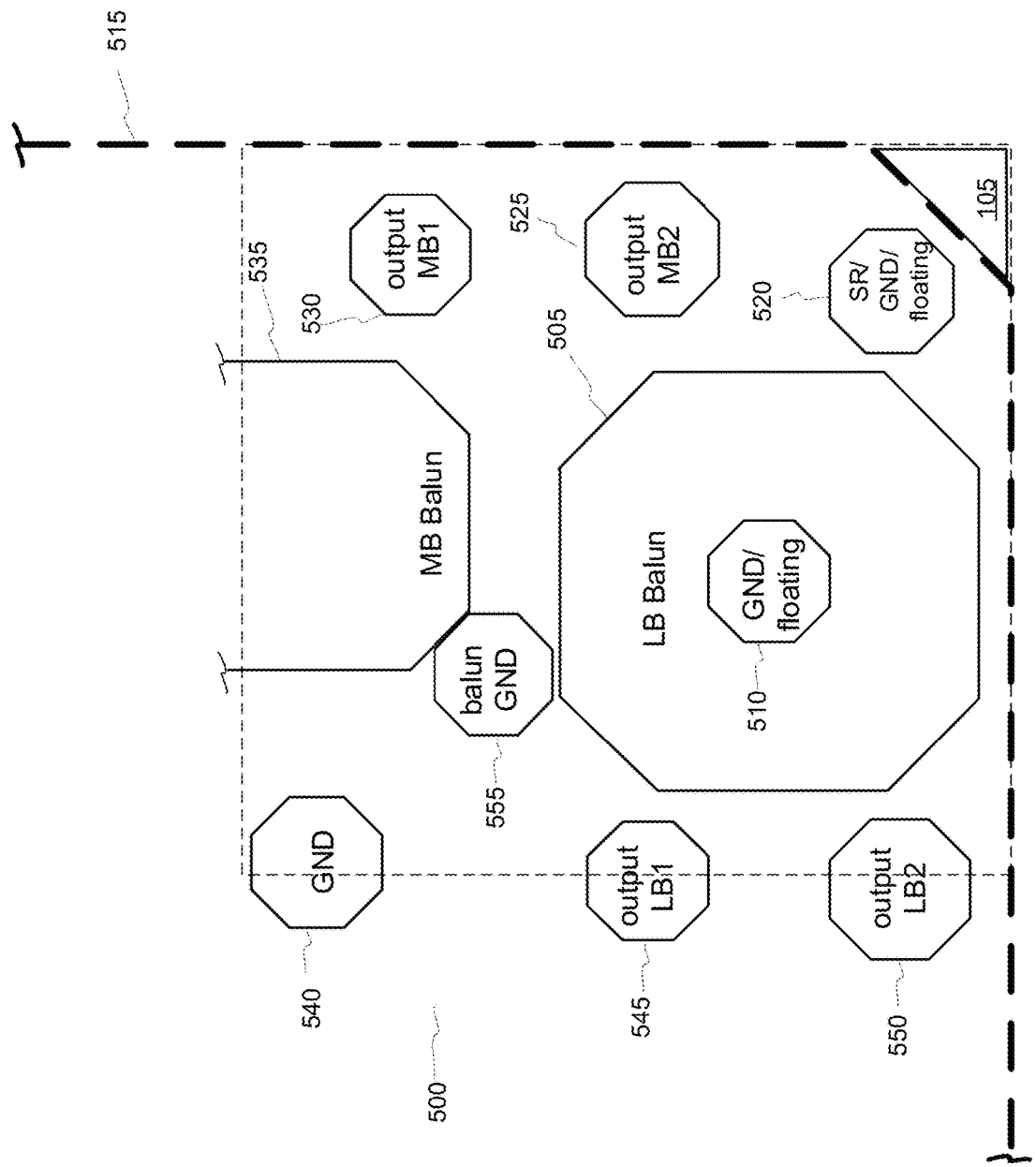
FIG. 5 is a plan view of a local bump region in accordance with an aspect of the disclosure.

Referring again to FIG. 2, note that it is beneficial for the associated active circuitry for balun 215 such as RF amplifier 210 to be located on the active die's surface immediately underneath balun 215. In general, the RF differential signal that RF amplifier 210 drives into balun 215 will be relatively powerful and thus will tend to strongly couple undesirably to other signals in transceiver die 205. But this coupling is reduced by keeping the associated circuitry in the immediate vicinity of balun 215. Turning now to FIG. 5, an example LBR 500 is shown in FIG. 5 in which a balun 505 is substantially contained within LBR 500. The location of balun 505 within LBR 500 enables transceiver die 205 to locate associated circuitry such as RF amplifier 215 in LBR 500 as well so as to significantly improve density. For example, the utilization factor for transceiver die 205 in LBR 500 may be increased to 80% or even to 90% or higher. Density is thus significantly improved as compared to the conventional 55% utilization factor. In this embodiment, a balun 505 is completely contained within LBR 500. However, portions of balun 505 may be outside of LBR 500 in alternative embodiments. To maintain the desired bump density, a pillar 510 is located within the center region 435 (FIG. 4B) of one or more of the coils in balun 505. Referring again to FIG. 4, balun 505 may have multiple stacked metal layer loops so that the first and second coils may magnetically couple to each other. Pillar 510 may be located substantially at the center of these loops. To reduce any coupling to the differential and single-ended RF signals that are processed by balun 505, pillar 510 is floating with respect to these RF signals. As used herein, a pillar is deemed to be floating with respect to a signal if there is no conducting trace or lead in the metal layers for the signal that connects through a via to the pillar. In some embodiments, pillar 510 may be connected to ground or be floating. In that regard, if a pillar is defined as floating without reference to any signal, then such a pillar is not conductively connected to any signal node nor to any DC node such as ground or to a power supply node. Although pillar 510 may be floating, note that the metal layers beneath pillar 510 may be patterned accordingly in a "dummy" fashion. In other words, even though no signals are being routed to pillar 510, the metal layers are patterned to support pillar 510 to, for example, provide greater structural integrity.

A transceiver die such as transceiver die 205 (FIG. 2) that underlies LBR 500 may operate over several frequency bands. The RF signals generated for each frequency band are processed by a corresponding balun. For example, transceiver die 205 may require a low-band balun, a mid-band balun, a high-band balun, and so on. Each balun is configured for operation in its corresponding frequency regime. For example, the low-band balun would be configured for a relatively-low frequency RF carrier signal. Similarly, the mid-band balun would be configured for a mid-range frequency RF carrier signal that is higher in frequency than the relatively-low frequency RF carrier signal. Note, however, that the mid-band may partially overlap with the low-band. In general, transceiver die 205 may have any number of such bands and corresponding baluns, and the outputs thereof may be routed to components such as respective power amplifiers configured to further process signals in the respective band. Although pillar 510 is floating with respect to any RF signals, balun 505 may be a low-band (LB) balun 505 in a multi-band embodiment to further reduce the interaction of pillar 510 with the RF signals in LB balun 505.

LBR 500 also contains a portion of another balun such as a mid-band (MB) balun 535. It will be appreciated that such a partial inclusion of another balun is optional. In general, it is beneficial to have a balun located near the periphery of transceiver die 205 since the single-ended RF signal that will be propagated to the power-amplifier die 230 (FIG. 2) is relatively powerful. To reduce power loss for such a signal, the routing distance between a balun output bump such as bump 235 and power amplifier die bump 240 should be reduced, which may result in the balun being located along the periphery of transceiver die 205. In some embodiments, a carrier frequency for mid-band balun 535 may be approximately 3 GHz. Similarly, a carrier frequency for low-band balun 505 may be approximately 1 GHz in some embodiments.

Referring again to LBR 500, the positioning of output pillars analogous to bump 235 will now be discussed. With regard to this positioning, note that the operation within any given frequency band may be divided further into frequency sub-bands or for operation with different signaling protocols. For example, MB balun 535 may be switched between operation in a first sub-band and in a second sub-band. Transceiver die 205 may thus have a band switch (not illustrated) that would have a first configuration in which MB balun 535 is driven by a first mid-band sub-band differential RF signal to produce a first mid-band sub-band (MB1) single-ended RF signal at an output MB1 pillar 530. Similarly, there may be a second configuration in which MB balun 535 is driven by a second mid-band sub-band differential RF signal to produce a second mid-band sub-band (MB2) single-ended RF signal at an output MB2 pillar 525. Pillars 530 and 525 are located near a periphery of LBR 500 and also the periphery of the corresponding transceiver die 205. As known in the semiconductor arts, the periphery of transceiver die 205 is associated with a seal ring formed in a corresponding metal layer. This seal ring is represented by a dashed line 515 in FIG. 5. Since output MB1 pillar 530 and output MB2 pillar 525 are adjacent the die periphery, these pillars are adjacent to the seal ring to one side of crack stop region 105 (and thus to one side of the vertex or corner of transceiver die 205). An edge of LB balun 505 is also adjacent the seal ring on the other side of crack stop region (and thus on the other side of the same die corner). Since LB balun 505 is adjacent the die periphery on one side of the die corner in LBR 500 whereas output MB1 pillar 530 and output MB2 pillar 325 are adjacent the die periphery on the other side of the die corner in LBR 500, there is room in LBR 500 for only one output pillar for LB balun 505 to be adjacent the die periphery. As discussed previously, there may be a minimum separation distance p between pillars in LBR 500. As used herein, a bump is deemed to be adjacent the die periphery in LBR 500 if such a bump is located within the distance p to the die periphery or to the inside edge of crack stop region 105. Given this proximity, no other bumps can be located between the die-periphery adjacent bump and the die periphery in some manufacturing and/or design processes.

LB balun 505 is analogous to MB balun 535 in that LB balun 505 has a first low-band sub-band (output LB1) pillar 545 and a second low-band sub-band (output LB2) pillar 550. As noted above, there is room at the die periphery in LBR 500 for only one such output bump. In one embodiment, it is output LB2 pillar 550 that is adjacent the die periphery although it may be output LB1 pillar 545 in alternative embodiments. Note that a pillar may be deemed to be within LBR 500 even if it is only partially-contained within LBR 500 as is the case for output LB1 pillar 545 and output LB2 pillar 550. Output LB1 pillar 545 is located along an inner periphery of LBR 500 and spaced apart from output LB2 pillar 550 by approximately the minimum separation distance P. Further along the same inner periphery of LBR 500 near an inner corner of LBR 500 is a ground (GND) pillar 540, which may serve as the ground pillar for MB balun 535. A balun GND pillar 555 located between MB balun 535 and LB balun 505 in LBR 500 serves as the ground pillar for LB balun 505. Finally, there is just enough room between LB balun 505 and crack stop 105 for a seal ring pillar 520 that overlies the seal ring and may serve as either a ground pillar or float. Although the preceding discussion concerns the integration of balun 505 into LBR 500, note that balun 505 may be replaced by a single coil forming a discrete inductor. The resulting single coil would thus have a central region that may be advantageously occupied by a bump analogously as discussed for pillar 510.

Referring again to FIG. 1, recall that an LBR having a length and width of 3 times the bump pitch p may require a minimum of six bumps to satisfy the minimum required bump density. Should LBR 500 have the same six-bump minimum bump density it will be appreciated that LBR may be re-arranged in numerous fashions yet still satisfy the minimum bump density. For example, if mid-band balun 535 is removed from LBR 500, pillars 530 and 525 may instead be used as the output ports for LB balun 505. Pillars 545 and 550 may thus be removed in such an embodiment or utilized for different purposes. In general, it is beneficial for the output pillars for a balun to be adjacent the balun to reduce the possibility of coupling to other signals. Note that LB balun 505 has a lower edge that is adjacent the die periphery such that there is no room for any pillars between this lower edge and the die periphery. For such a balun, the output pillars may thus be located to either side of the balun so as to reduce the routing distance between the balun and the output pillars. In LB balun 505, output pillars 545 and 550 are on the left side of balun 505 but may be relocated to the right side in alternative embodiments. In contrast, replacing ground pillar 555 with an output pillar would be less beneficial as pillar 555 is relatively more removed from the die periphery. There are thus numerous ways in which pillars may be arranged within an LBR that includes a pillar-containing balun in accordance with the concepts disclosed herein. For example, LBR 500 could have six pillars, seven pillars, or more than eight pillars in alternative embodiments.

A method of RF signaling will now be discussed with regard to a flowchart shown in FIG. 6. The method includes an act 600 of driving a differential RF signal into a first coil of a balun located within a local bump region abutting a corner region for an RF flip chip die, the first coil being formed about a central balun region including a floating copper pillar for the local bump region. An example of act 600 is the driving of LB balun 505 with a differential RF signal. The method further includes an act 605 of producing a single-ended RF signal in a second coil of the balun responsive to the driving of the differential RF signal. The production of a single-ended RF signal in one of the output pillars for LB balun 505 is an example of act 605.

A method of receiving an RF signal would be analogous. For example, such a method may include an act of driving a single-ended RF signal in a first coil of a balun located within a local bump region abutting a corner region for an RF flip chip die, the first coil being formed about a central balun region including a floating copper pillar for the local bump region. The driving of a received RF signal into LB balun 505 is an example of such an act. In addition, the method of receiving an RF signal may include an act of producing a differential RF signal in a second coil of the balun responsive to the driving of the single-ended RF signal. The production of a received RF differential signal in LB balun 505 is an example of such an act.

Figure 7:
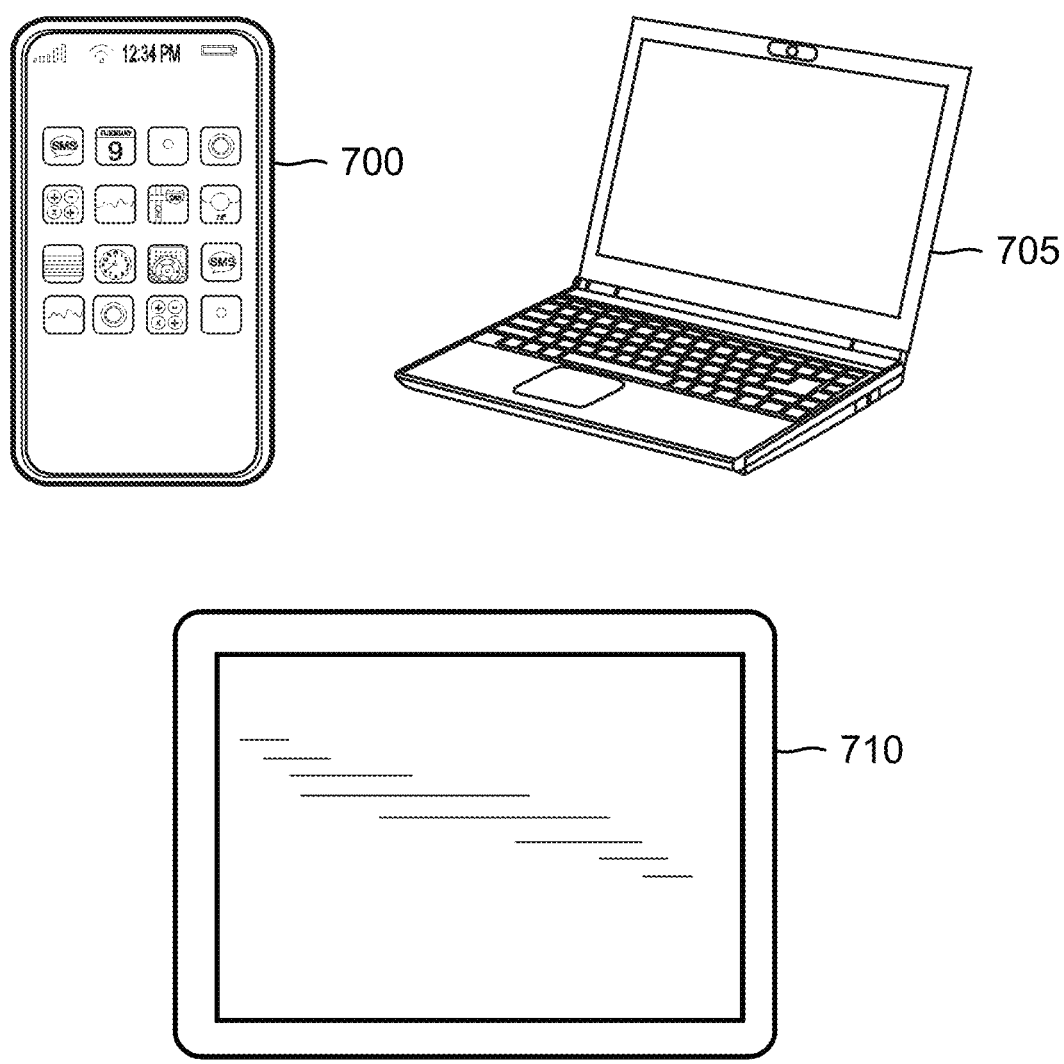
FIG. 7 illustrates some example electronic systems each incorporating an RF flip chip in accordance with an aspect of the disclosure.

An RF flip chip as disclosed herein may be advantageously incorporated in any suitable mobile device or electronic system. For example, as shown in FIG. 7, a cellular telephone 700, a laptop computer 705, and a tablet PC 710 may all include an RF flip chip in accordance with the disclosure. Other exemplary electronic systems such as a communication device or a personal computer may also be configured with RF flip chips constructed in accordance with the disclosure.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:
1. An RF flip chip die, comprising:
  a crack stop region including a corner of the die; and
  a local bump region abutting the crack stop region, the local bump region including:
    a first balun formed by coils arranged about a center region; and
    a die interconnect located within the center region.
2. The RF flip chip die of claim 1, wherein the die interconnect is a solder ball.
3. The RF flip chip die of claim 1, wherein the die interconnect is a metallic pillar.
4. The RF flip chip die of claim 3, wherein the metallic pillar is a copper pillar.

5. The RF flip chip die of claim 4, the local bump region further including a portion of a second balun.

6. The RF flip chip die of claim 5, wherein the copper pillar is configured to float with respect to RF signals carried by the first balun.

7. The RF flip chip die of claim 6, wherein the first balun is configured to process a low-band differential carrier RF signal and the second balun is configured to process a mid-band differential carrier RF signal having a higher frequency than the low-band differential carrier RF signal.

8. The RF flip chip die of claim 6, wherein an edge of the first balun is within a minimum bump separation distance to a periphery of the die on a first side of the crack stop region, and wherein the local bump region includes a first output pillar for the second balun adjacent a periphery of the die on a second side of the crack stop region.

9. The RF flip chip die of claim 8, wherein the local bump region includes a first output pillar for the first balun adjacent an inner periphery of the local bump region.

10. The RF flip chip die of claim 9, the local bump region further comprising:
a second output pillar for the first balun; and
a second output pillar for the second balun.

11. The RF flip chip die of claim 8, further comprising a seal ring pillar located in a portion of the local bump region between the crack stop region and the first balun.

12. The RF flip chip die of claim 6, wherein the RF flip chip die is bonded through the copper pillar to a substrate for an RF system-in-package, the RF system-in-package further comprising a power amplifier configured to amplify a single-ended RF signal from the first balun.

13. The RF flip chip die of claim 6, wherein a width and a height of the local bump region is three times a minimum bump separation distance.

14. The RF flip chip die of claim 5, wherein the copper pillar is grounded.

15. The RF flip chip die of claim 1, wherein the RF flip chip die is integrated within a cellular telephone.

16. An RF die, comprising:
a semiconductor substrate having a crack stop region including a corner of the die and having a corner region abutting the crack stop region;
a plurality of metal layers adjacent the corner region, the plurality of metal layers being configured to form a first balun having coils;
a first pillar within a center region of the coils; and
an uppermost dielectric layer having a portion located between the center region of the coils and the first pillar.

17. The RF die of claim 16, further comprising an underbump metallization between the first pillar and the uppermost dielectric layer.

18. The RF die of claim 16, wherein the first pillar is a first copper pillar.

19. The RF die of claim 18, wherein the first copper pillar is configured to float with respect to RF signals for the first balun.

20. The RF die of claim 18, wherein the first copper pillar is a ground node for the first balun.

21. The RF die of claim 18, wherein the corner region includes an additional seven copper pillars.

* * * * *